US012772820B2

(12) United States Patent
Wu et al.

(10) Patent No.: US 12,772,820 B2
(45) Date of Patent: Oct. 20, 2026

(54) SEMICONDUCTOR STRUCTURE, THREE-DIMENSIONAL MEMORY, MEMORY SYSTEM, AND ELECTRONIC DEVICE

(71) Applicant: YANGTZE MEMORY TECHNOLOGIES CO., LTD., Wuhan (CN)

(72) Inventors: Jiajia Wu, Wuhan (CN); Wei Xu, Wuhan (CN); Bin Yuan, Wuhan (CN); Lei Xue, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 827 days.

(21) Appl. No.: 18/092,105

(22) Filed: Dec. 30, 2022

(65) Prior Publication Data

US 2024/0194606 A1 Jun. 13, 2024

(30) Foreign Application Priority Data

Dec. 9, 2022 (CN) ........................ 202211580275.8

(51) Int. Cl.

| | |
|---|---|
| ***H10W 20/20*** | (2026.01) |
| ***H10B 41/27*** | (2023.01) |
| ***H10B 43/10*** | (2023.01) |
| ***H10B 43/27*** | (2023.01) |
| ***H10B 43/40*** | (2023.01) |
| ***H10B 43/50*** | (2023.01) |

(52) U.S. Cl.

CPC ............ *H10W 20/20* (2026.01); *H10B 43/27* (2023.02)

(58) Field of Classification Search

CPC ........ H10B 43/40; H10B 43/50; H10B 41/27; H10B 43/10; H10B 43/27; H10W 20/20

See application file for complete search history.

(56) References Cited

U.S. PATENT DOCUMENTS

| | | | | |
|---|---|---|---|---|
| 2019/0019872 A1* | 1/2019 | Lim | ..................... | H10D 30/694 |
| 2020/0105783 A1* | 4/2020 | Baek | ..................... | H10B 43/27 |
| 2020/0235121 A1* | 7/2020 | Liu | ..................... | H10B 41/10 |
| 2022/0115344 A1* | 4/2022 | Kim | ..................... | H10W 90/00 |

* cited by examiner

*Primary Examiner* — Dale E Page
*Assistant Examiner* — Christian A Tivarus
(74) *Attorney, Agent, or Firm* — BAYES PLLC

(57) ABSTRACT

A semiconductor structure includes a stack structure, first gate isolation structures, and conductive structures. The stack structure includes gate layers and first dielectric layers disposed alternately. The first gate isolation structures extend along a first direction, and the first gate isolation structures are arranged at intervals along a second direction and divide the stack structure into at least one block comprising a memory region and a connection region that are distributed along the first direction. The conductive structures are located in the connection region, and orthographic projections of upper ends of at least two conductive structures on a reference plane at least partially overlap. The reference plane is perpendicular to the second direction, and the first direction is perpendicular to the second direction.

20 Claims, 10 Drawing Sheets

SEMICONDUCTOR STRUCTURE, THREE-DIMENSIONAL MEMORY, MEMORY SYSTEM, AND ELECTRONIC DEVICE

CROSS-REFERENCE TO RELATED APPLICATIONS

This application claims the benefit of priority to Chinese Application No. 202211580275.8, filed on Dec. 9, 2022, which is incorporated herein by reference in its entirety.

TECHNICAL FIELD

The present disclosure relates to the technical field of semiconductor chips, in particular to a semiconductor structure, a three-dimensional (3D) memory, a memory system, and an electronic device.

BACKGROUND

As feature sizes of memory cells approach a lower limit of a process, a planar process and a fabrication technique become challenging and costly, which causes a memory density of two-dimensional (2D) or planar NAND flash memories to approach an upper limit.

To overcome the limitations brought by the 2D or planar NAND flash memories, the industry has developed a memory with a three-dimensional structure (e.g., 3D NAND), in which memory cells are arranged on a substrate three-dimensionally to increase memory density.

With the increase in the number of layers of the 3D NAND, how to reduce the area proportion of a connection region to improve the memory density of the 3D NAND is a problem that urgently needs to be addressed currently.

SUMMARY

The present disclosure provides a semiconductor structure, a three-dimensional memory, a memory system, and an electronic device, intending to reduce an area proportion of a connection region in the semiconductor structure to improve a memory density of the three-dimensional memory. To achieve the above purpose, the present disclosure uses the following technical solution:

In one aspect, a semiconductor structure is provided. The semiconductor structure includes a stack structure, a plurality of first gate isolation structures, and a plurality of conductive structures. The stack structure comprises a plurality of gate layers and a plurality of first dielectric layers which are disposed alternately. The first gate isolation structures extend along a first direction, and the plurality of the first gate isolation structures are arranged at intervals along a second direction. The plurality of first gate isolation structures divide the stack structure into at least one block, and the block comprises a memory region and a connection region that are distributed along the first direction. The plurality of conductive structures are located in the connection region, each conductive structure is electrically connected with one gate layer, and the different conductive structures are electrically connected with the different gate layers. Any two adjacent ones of the conductive structures have a spacing therebetween, and orthographic projections of upper ends of at least two conductive structures on a reference plane at least partially overlap. The reference plane is perpendicular to the second direction, and the first direction is perpendicular to the second direction.

For the semiconductor structure provided by the above embodiments of the present disclosure, the plurality of first gate isolation structures divide the stack structure into at least one block, and the block comprises a memory region and a connection region that are distributed along the first direction. The upper ends of the conductive structures refer to the ends of the conductive structures far away from the gate layers connected therewith. Among the plurality of conductive structures in one block, the orthographic projections of the upper ends of the at least two conductive structures on the reference plane at least partially overlap, and the reference plane is perpendicular to the second direction, that is, at least portions of the upper ends of the at least two conductive structures are disposed in juxtaposition along the second direction; in this way, at least two conductive structures can share a space of the connection region in the first direction, thereby facilitating to decrease the size of the connection region along the first direction. Since the connection region and the memory region are the same in size along the second direction, an area proportion of the connection region in the semiconductor structure can be reduced by decreasing the size of the connection region along the first direction, thereby increasing an area proportion of the memory region, which is advantageous to improve the memory density of the semiconductor structure, and further to improve the memory density of the three-dimensional memory.

In some embodiments, the plurality of conductive structures are arranged in multiple columns, and each column includes at least two conductive structures disposed along the second direction. The orthographic projections of the upper ends of the at least two conductive structures of the same column on the reference plane at least partially overlap.

In some embodiments, a spacing between the upper ends of two adjacent conductive structures of the same column is greater than or equal to 500 nm.

In some embodiments, the plurality of conductive structures are arranged in at least two rows, and each row includes at least two conductive structures disposed at intervals along the first direction. The semiconductor structure further comprises a second gate isolation structure. The second gate isolation structure is located between two adjacent rows of the conductive structures, runs through the stack structure, and extends along the first direction. A spacing is between the second gate isolation structure and each of the two adjacent rows of the conductive structures.

In some embodiments, the spacing between the second gate isolation structure and the upper ends of the two adjacent rows of the conductive structures is greater than or equal to 600 nm. And/or, along the first direction, a spacing between the upper ends of two adjacent conductive structures is greater than or equal to 500 nm.

In some embodiments, the gate layer comprises a body portion and two first conductive pathways. The body portion is located in the memory region, and the two first conductive pathways are located on two sides of the second gate isolation structure along the second direction. The first conductive pathways run through the connection region along the first direction, and are electrically connected with the body portion, and the conductive structure is electrically connected with the first conductive pathway.

In some embodiments, the second gate isolation structure comprises a plurality of second isolation substructures extending along the first direction, and two adjacent ones of the second isolation substructures have a spacing therebetween. The gate layer further comprises a connection portion between two adjacent ones of the second isolation substructures, and the connection portion is electrically connected with the two first conductive pathways.

In some embodiments, along the first direction, a spacing between upper ends of the two adjacent second isolation substructures is less than or equal to 600 nm.

In some embodiments, the second gate isolation structure runs through the connection region along the first direction.

In some embodiments, the semiconductor structure further comprises a plurality of first dummy channel structures. The plurality of first dummy channel structures are located between the second gate isolation structure and each of the two rows of the conductive structures. The first dummy channel structures run through the stack structure.

In some embodiments, the semiconductor structure further comprises at least one third gate isolation structure. The at least one third gate isolation structure is located in the memory region, runs through the stack structure, and extends along the first direction. The at least one third gate isolation structure divides the memory region into at least two memory fingers. The second gate isolation structure and the third gate isolation structure have a spacing therebetween.

In some embodiments, the semiconductor structure further comprises a plurality of memory channel structures, a select gate stack structure, and a plurality of semiconductor contact pillars. The plurality of memory channel structures are located in the memory fingers and arranged in multiple rows. Each memory finger comprises 4N rows of channel structures, where N is an integer greater than or equal to 2. The select gate stack structure is disposed on the stack structure, and comprises a conductor layer and a second dielectric layer that are disposed in a stack-up manner. The plurality of semiconductor contact pillars run through the select gate stack structure, and one semiconductor contact pillar is electrically connected with one memory channel structure.

In some embodiments, each block comprises three memory fingers, and each memory finger comprises twelve or sixteen rows of memory channel structures.

In some embodiments, the semiconductor structure further comprises a plurality of memory channel structures, at least one row of second dummy channel structures, and at least one top select gate cut structure. The plurality of memory channel structures are located in the memory fingers and arranged in multiple rows. Each memory finger comprises 4N rows of channel structures, where N is an integer greater than or equal to 2. The at least one row of the second dummy channel structures is located in the memory finger, and located between two adjacent rows of the memory channel structures. One row of the second dummy channel structures includes a plurality of second dummy channel structures disposed at intervals along the first direction, and there is a spacing between the upper end of the second dummy channel structure and at least one gate layer. At least one top select gate cut structure runs through the at least one gate layer at the top of the stack structure. An orthographic projection of one top select gate cut structure on the semiconductor layer at least partially overlaps with an orthographic projection of one row of the second dummy channel structures on the semiconductor layer.

In some embodiments, each block comprises four memory fingers, and each memory finger comprises eight rows of memory channel structures and one row of second dummy channel structures. Along the second direction, four rows of memory channel structures are disposed on each of two sides of the one row of the second dummy channel structures.

In some embodiments, the conductive structure includes a first portion and a second portion. The first portion is disposed in the same layer as the gate layer, and electrically connected with the gate layer. The second portion is connected with the first portion and runs through the stack structure upwards. Orthographic projection of the second portion on the first portion is located within an extent of the first portion.

In some embodiments, the gate layer comprises a body portion in the memory region, and second conductive pathways on two sides of the first gate isolation structure. The second conductive pathways extend along the first direction, and are electrically connected with the body portion, and the first portion of the conductive structure is electrically connected with the second conductive pathways. The stack structure further comprises a plurality of dielectric patterns which are located in the connection region, each dielectric pattern is disposed in the same layer as one gate layer, and the dielectric pattern is located between the two second conductive pathways.

In another aspect, a three-dimensional memory is provided. The three-dimensional memory comprises a periphery device, and the semiconductor structure of any of the above embodiments. The periphery device is electrically connected with the semiconductor structure.

In yet another aspect, a memory system is provided. The memory system includes the three-dimensional memory as described above, and a controller electrically connected with the three-dimensional memory to control the three-dimensional memory to store data.

In yet another aspect, an electronic device is provided, which comprises the memory system as described above.

It may be understood that the advantageous effects capable of being achieved by the three-dimensional memory, the memory system, and the electronic device provided by the above embodiments of the present disclosure may be referred to those of the above semiconductor structure, which is not repeated here.

BRIEF DESCRIPTION OF THE DRAWINGS

The figures to be used in some embodiments of the present disclosure will be briefly introduced below for the purpose of illustrating the technical solutions in the present disclosure more clearly. Apparently, the figures in the following description are figures of some embodiments of the present disclosure, and those of ordinary skill in the art may also obtain other figures according to these figures. Furthermore, the figures in the following description may be regarded as schematic diagrams, rather than making limitations to actual sizes of products as involved in the embodiments of the present disclosure.

DETAILED DESCRIPTION

Figure 1:
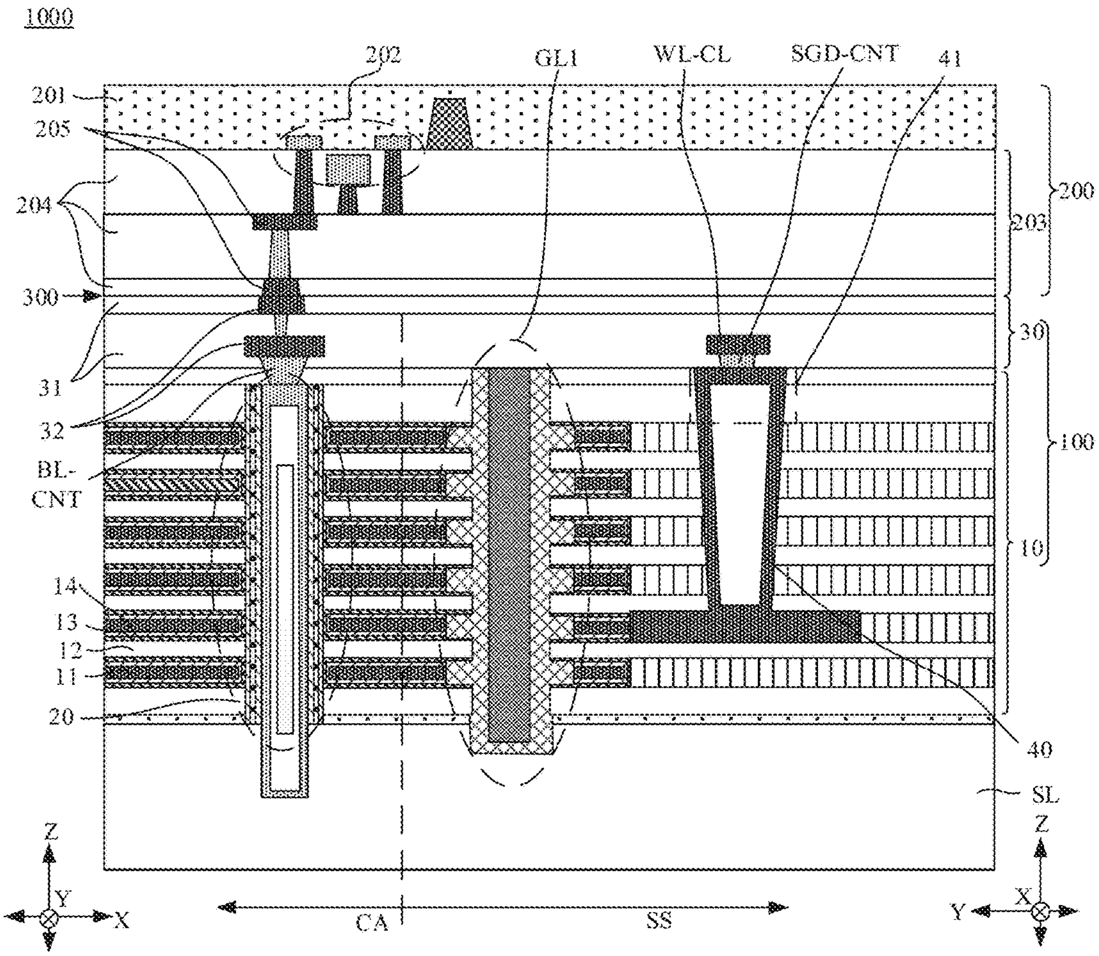
FIG. 1 is a structural schematic diagram of a three-dimensional memory according to some embodiments.

The technical solutions in some embodiments of the present disclosure will be described below clearly and completely in conjunction with the figures. Apparently, the described embodiments are merely part of the embodiments of the present disclosure, rather than all of the embodiments. Based on the embodiments provided by the present disclosure, all other embodiments obtained by those of ordinary skill in the art shall fall in the protection scope of the present disclosure.

In the description of the present disclosure, it should be understood that, the orientation or position relationships as indicated by the terms "center," "upper," "lower," "front," "rear," "left," "right," "vertical," "horizontal," "top," "bottom," "inner," "outer" and the like are based on the orientation or position relationships as shown in the figures, which are used to facilitate description of the present disclosure and simplify the description, instead of indicating or implying that the indicated apparatus or element has a specific orientation or be constructed and operated in a specific orientation; and accordingly, they cannot be interpreted as limitations to the present disclosure.

Unless otherwise required in the context, the term "comprising" is interpreted as open-ended including, i.e., "including, but not limited to," throughout the specification and the claims. In the description of the specification, the terms "one embodiment," "some embodiments," "exemplary embodiments," "as an example" or "some examples," or the like are intended to indicate that particular features, structures, materials or characteristics related to that embodiment or example are included in at least one embodiment or example of the present disclosure. The illustrative representations of the above terms do not necessarily refer to the same embodiment or example. Furthermore, the particular features, structures, materials, or characteristics may be included in any one or more embodiments or examples in any suitable manner.

In the following, the terms "first" and "second" are only used for the purpose of description but cannot be interpreted as indicating or implying relative importance, or implicitly indicating the number of the technical features as indicated. As such, the features defined by "first" and "second" may explicitly or implicitly include one or more of the features. In the description of the embodiments of the present disclosure, unless otherwise stated, "multiple" means two or more.

"Coupling" and "connecting" and derivative expressions thereof may be used when describing some embodiments. For example, when describing some embodiments, the term "connecting" may be used to indicate that two or more components have direct physical contact or electrical connection therebetween. For another example, when describing some embodiments, the term "coupling" may be used to indicate that two or more components have direct physical contact or electrical connection. However, the term "coupling" may also indicate that two or more components do not have direct contact therebetween, but still cooperate or interact with each other. The embodiments as disclosed here are not necessarily limited to those herein.

"At least one of A, B and C" and "at least one of A, B or C" have the same meaning, and both include following combinations of A, B and C: A alone, B alone, C alone, a combination of A and B, a combination of A and C, a combination of B and C, and a combination of A, B and C.

"A and/or B" includes the following three combinations: A alone, B alone, and a combination of A and B.

The use of "adapted to" or "configured to" herein means an open and inclusive language and does not preclude a device adapted to or configured to perform additional tasks or steps.

In addition, the use of "based on" means open and inclusive, because processes, steps, calculations or other actions "based on" one or more stated conditions or values may be based on additional conditions or exceed the stated values.

In the contents of the present disclosure, the meanings of "on", "above", and "over" should be interpreted in the broadest manner such that "on" not only means "directly on something" but also includes the meaning of "on something" with an intermediate feature or layer therebetween, and that "above" or "over" not only means "above" or "over" something but also includes the meaning it is "above" or "over" something with no intermediate feature or layer therebetween (i.e., directly on something).

Exemplary implementations are described herein with reference to the sectional views and/or plan views as idealized exemplary figures. In the figures, thicknesses of layers and regions are exaggerated for clarity. Therefore, variations in shapes with respect to the figures due to, for example, a manufacturing technology and/or tolerance may be anticipated. Therefore, the exemplary implementations should not be interpreted as being limited to the shapes of the regions as shown herein, but as including shape deviations caused by, for example, manufacturing. For example, an etched region shown as rectangular will generally have curved features. Accordingly, the regions as shown in the figures are illustrative in essence, and their shapes are not intended to show actual shapes of the regions of the device, and not intended to limit the scope of the exemplary implementations.

Figure 2:
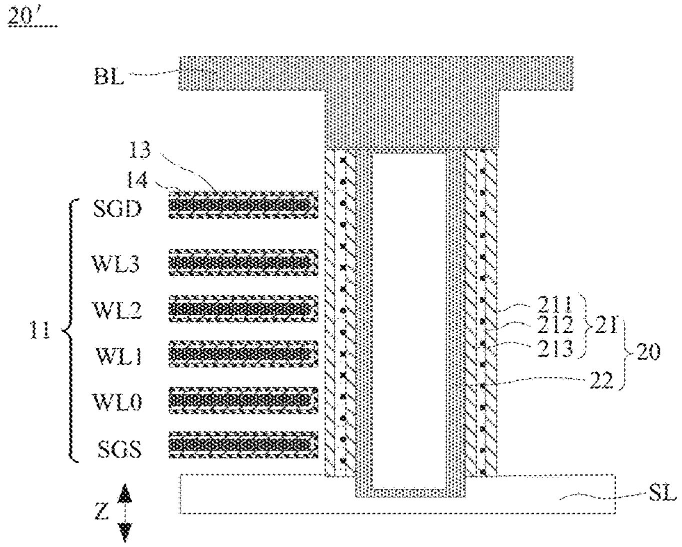
FIG. 2 is a structural diagram of a memory cell string according to some embodiments.
Figure 3:
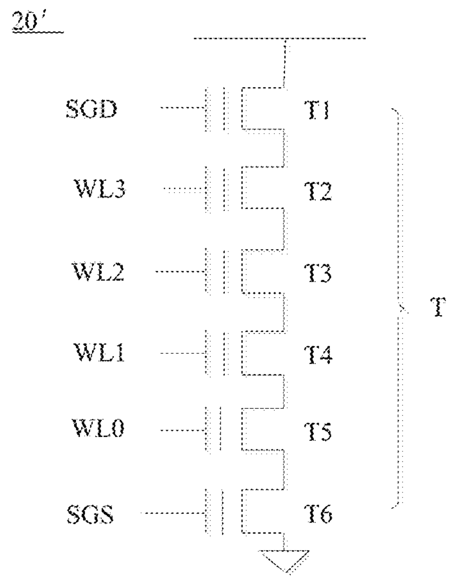
FIG. 3 is an equivalent circuit diagram of the memory cell string as shown in FIG. 2.

FIG. 1 is a sectional view of a three-dimensional memory provided by some embodiments of the present disclosure, FIG. 2 is a sectional diagram of one memory cell string of the three-dimensional memory in FIG. 1, and FIG. 3 is an equivalent circuit diagram of the memory cell string in FIG. 2.

As used herein, whether one component is "on," "above" or "below" another component (e.g., a layer, a structure, or a device) of a three-dimensional memory is determined relative to a semiconductor layer SL of a semiconductor structure 100 in a third direction Z when the semiconductor layer SL is located in the lowest plane of the semiconductor structure 100 in the third direction Z. The same notion for describing the spatial relationships is applied throughout the present disclosure.

Here, in order to more clearly show a structure of a three-dimensional memory, FIG. 1 shows a view of a memory region CA based on the left coordinate system, and a connection region SS based on the right coordinate system, that is, the view of the memory region CA shows a sectional structure of the memory region CA of a three-dimensional memory 1000 along an X direction (a first direction), and the view of the connection region SS shows a sectional structure of the connection region SS of the three-dimensional memory 1000 along the Y direction.

Some embodiments of the present disclosure provide a three-dimensional memory 1000. Referring to FIG. 1, the three-dimensional memory 1000 may comprise a semiconductor structure 100, a semiconductor layer SL electrically connected with the semiconductor structure 100, and a periphery device 200 electrically connected with the semiconductor structure 100.

As an example, a material of the above semiconductor layer SL may comprise a semiconductor material, for example, monocrystalline silicon, polysilicon, monocrystalline germanium, a III-V compound semiconductor material, a II-VI compound semiconductor material, and other suitable semiconductor materials. The semiconductor layer SL may be doped partially or entirely. For instance, the semiconductor layer SL may comprise a doping region that is doped with a P-type dopant. The semiconductor layer SL may also comprise a non-doped region.

The semiconductor structure 100 may comprise a stack structure 10, a memory channel structure 20 running through the stack structure 10 along a third direction and located within the stack structure 10, and an array interconnect layer 30 disposed above the stack structure 10 (a side far away from the semiconductor layer SL).

The stack structure 10 may comprise a plurality of gate layers 11 and first dielectric layers 12, which are disposed alternately.

In some embodiments, as shown in FIGS. 1 and 2, a metal compound layer 13 and a fourth dielectric layer 14 may be included between the gate layer 11 and the first dielectric layer 12. The metal compound layer 13 covers the gate layer 11, and is used to improve an adhesion force between the gate layer 11 and the first dielectric layer 12. A material of the metal compound layer 13 comprises at least one of titanium nitride, tantalum nitride and tungsten carbide. The fourth dielectric layer 14 covers the metal compound layer 13 to reduce risk of a charge in a memory cell string 20' flowing to the gate layer 11. As an example, a material of the fourth dielectric layer 14 comprises at least one of aluminum oxide, hafnium oxide, and tantalum oxide.

Referring to FIG. 2, the memory channel structure 20 may comprise a memory functional layer 21 and a channel layer 22 that are disposed in sequence. The memory functional layer 21 may comprise a blocking layer 211, a charge trap layer 212, and a tunneling layer 213. The charge trap layer 212 is used to store a charge, and the blocking layer 211 is used to block the charge stored in the charge trap layer 212 and provide an electrical insulation between the charge trap layer 212 and the gate layers 11. The tunneling layer 213 is used to generate a charge (electrons or holes).

As an example, a material of the blocking layer 211 includes, but not limited to, silicon oxide, a material of the charge trap layer 212 includes, but not limited to, silicon nitride, and a material of the tunneling layer 213 includes, but not limited to, silicon oxide. In some embodiments, when the material of the blocking layer 211 is silicon oxide, the material of the charge trap layer 212 is silicon nitride, and the material of the tunneling layer 213 is silicon oxide, the memory functional layer 21 can be formed as an "ONO" structure. The channel layer 22 is used to transport the required charge, and a material of the channel layer 22 includes, but not limited to, doped polysilicon.

The memory channel structure 20 and the gate layers 11 jointly form the memory cell string 20' (for example, a NAND memory cell string 20'). As an example, referring to FIGS. 2 and 3, the memory cell string 20' may comprise a plurality of transistors T, one transistor T (for example, T1-T6 in FIG. 3) may be disposed as one memory cell, and these transistors T are connected together to form the memory cell string 20'. One transistor T may be formed by the channel layer 22 and one gate layer 11 surrounding the channel layer 22.

Here, along the third direction Z, the uppermost gate layer 11 of the plurality of gate layers 11 (the gate layer 11 farthest from the semiconductor layer SL) may be constructed as a drain select gate SGD, which is configured to control an on state of the transistor T1 to further control an on state of one drain pathway in the memory cell string 20'.

Along the third direction Z, the middle gate layers 11 of the plurality of gate layers 11 may be constructed as a plurality of word lines WL, for example, including a word line WL0, a word line WL1, a word line WL2 and a word line WL3. By writing different voltages to the word lines WL, data writing, reading and erasing of individual memory cells (for example, transistors T) in the memory cell string 20' may be accomplished.

Along the third direction Z, the lowest gate layer (the gate layer closest to the source layer SL) of the plurality of gate layers 11 may be constructed as a source select gate SGS, which is configured to control an on state of the transistor T6 to further control an on state of one source pathway in the memory cell string 20'.

The gate layers 11 are configured to control an on state of the transistors T. A lower end (an end close to the semiconductor layer SL) of the channel layer 22 of the memory channel structure 20 is coupled with the semiconductor layer SL that forms a source of the memory cell string 20'.

It should be understood that, the number of the transistors T in FIGS. 2 and 3 is only illustrative, and the embodiments of the present disclosure do not limit the number of the transistors T which the memory cell string 20' comprises; for example, the memory cell string 20' may comprise 4, 16, 32, 64 or more transistors.

As shown in FIG. 1, the array interconnect layer 30 may comprise a drain (for example, a bit line BL) of the memory cell string 20', which may be coupled with an upper end (an end far away from the semiconductor layer SL) of the channel layer 22 of the memory channel structure 20.

The array interconnect layer 30 may comprise one or more first interlayer insulating layers 31, and may further comprise a plurality of contacts insulated from each other by these first interlayer insulating layers 31, and for example, the contacts may comprise a bit line contact BL-CNT that is coupled with a bit line BL.

A material of the above first interlayer insulating layers 31 is an insulating material which includes at least one of silicon oxide, silicon nitride, silicon oxynitride, doped silicon oxide, an organosilicate glass, a dielectric metal oxide (e.g., aluminum oxide, hafnium dioxide, etc.) and silicate thereof, and an organic insulating material, and the embodiments of the present disclosure do not impose specific limitations thereto.

The array interconnect layer 30 may further comprise one or more first interconnect conductor layers 32. The first interconnect conductor layers 32 may comprise a plurality of connection lines, for example, bit lines BL, and word line connection lines (not shown in the figures) coupled with the word lines WL.

Materials of the first interconnect conductor layer 32 and the contact may be a conductive material, which may, for example, be one of tungsten, cobalt, copper, aluminum, and metal silicide or any combination thereof. It may be understood that the materials of the first interconnect conductor layer 32 and the contact may also be other suitable conductive materials, which are not enumerated anymore here.

Continuing to refer to FIG. 1, the periphery device 200 is disposed above the semiconductor structure 100 (for example, disposed on a side of the array interconnect layer 30 far away from the semiconductor layer SL), and may comprise a periphery circuit. The periphery circuit may be configured to control and sense the semiconductor structure 100. The periphery circuit can be any suitable digital, analog, and/or mixed-signal control and sensing circuit used for supporting the operation (or functioning) of the semiconductor structure 100, including, but not limited to, a page buffer, a decoder (e.g., a row decoder and a column decoder), a sensing amplifier, a driver (e.g., a gate line driver), a charge pump, a current or voltage reference, or any active or passive components (e.g., transistors, diodes, resistors, or capacitors) of the circuit. The periphery circuit may further include any other circuits compatible with the advanced logic processes, including a logic circuit, such as a processor and a programmable logic device (simply as PLD), or a memory circuit, such as a static random-access memory (simply as SRAM).

In some embodiments, as shown in FIG. 1, the periphery device 200 may comprise a substrate 201, a periphery circuit disposed over the substrate 201, and a periphery interconnect layer 203 disposed over the substrate 201. The periphery circuit may comprise a transistor 202.

A material of the substrate 201 may be monocrystalline silicon, or may be other suitable materials, e.g., silicon germanium, germanium, or a silicon on insulator film.

The periphery interconnect layer 203 is coupled with the transistor 202 to implement transmission of an electrical signal between the transistor 202 and the periphery interconnect layer 203. The periphery interconnect layer 203 may comprise one or more second interlayer insulating layers 204, and may further comprise one or more second interconnect conductor layers 205. The different second interconnect conductor layers 205 may be coupled by a contact.

Materials of the second interconnect conductor layer 205 and the contact may be a conductive material, which may be, for example, one of tungsten, cobalt, copper, aluminum, and metal silicide or any combination thereof, and may also be other suitable materials.

A material of the second interlayer insulating layer 204 is an insulating material, which may be, for example, one of silicon oxide, silicon nitride, and a high-k insulating material or any combination thereof, and may also be other suitable materials.

The periphery interconnect layer 203 of the above periphery device 200 may be coupled with the array interconnect layer 30 of the semiconductor structure 100 to couple the semiconductor structure 100 with the periphery device 200.

Since the periphery interconnect layer 203 is coupled with the array interconnect layer 30, the periphery circuit in the periphery device 200 may be coupled with the memory channel structure 20 in the semiconductor structure 100 to implement transmission of an electrical signal between the periphery circuit and the memory channel structure 20.

In some possible implementations, referring to FIGS. 1 and 2, a bonding interface 300 may be disposed between the periphery interconnect layer 203 and the array interconnect layer 30, and the periphery interconnect layer 203 and the array interconnect layer 30 are bonded and coupled with each other through the bonding interface 300.

In some embodiments, an electrical contact between the gate layer 11 and a word line contact SGD-CNT is implemented through a self-align contact (SCT) architecture. The SCT architecture is not formed as a staircase structure, but is embedded into a conductive structure 40 in the connection region SS, and the gate layer 11 is led out through the conductive structure 40 to implement an electrical connection between the gate layer 11 and the word line contact SGD-CNT. A word line connection line WL-CL is in electrical contact with the word line contact SGD-CNT to enable an electrical signal to be transmitted between the word line connection line WL-CL and the gate layer 11.

However, with the increase in the number of layers (the number of gate layers) of the 3D NAND, the number of the conductive structures 40 also increases (each gate layer 11 is led out by one conductive structure 40). In the related art, multiple conductive structures occupy a larger area to result in a larger proportion of the connection region SS on an X-Y plane, that is, a ratio of the area of the connection region SS to the area of the memory region CA is larger, resulting to the reduction of the memory density of the three-dimensional memory 1000. Based on that, how to decrease the area proportion of the connection region SS is a problem needed to be solved currently.

Figure 4:
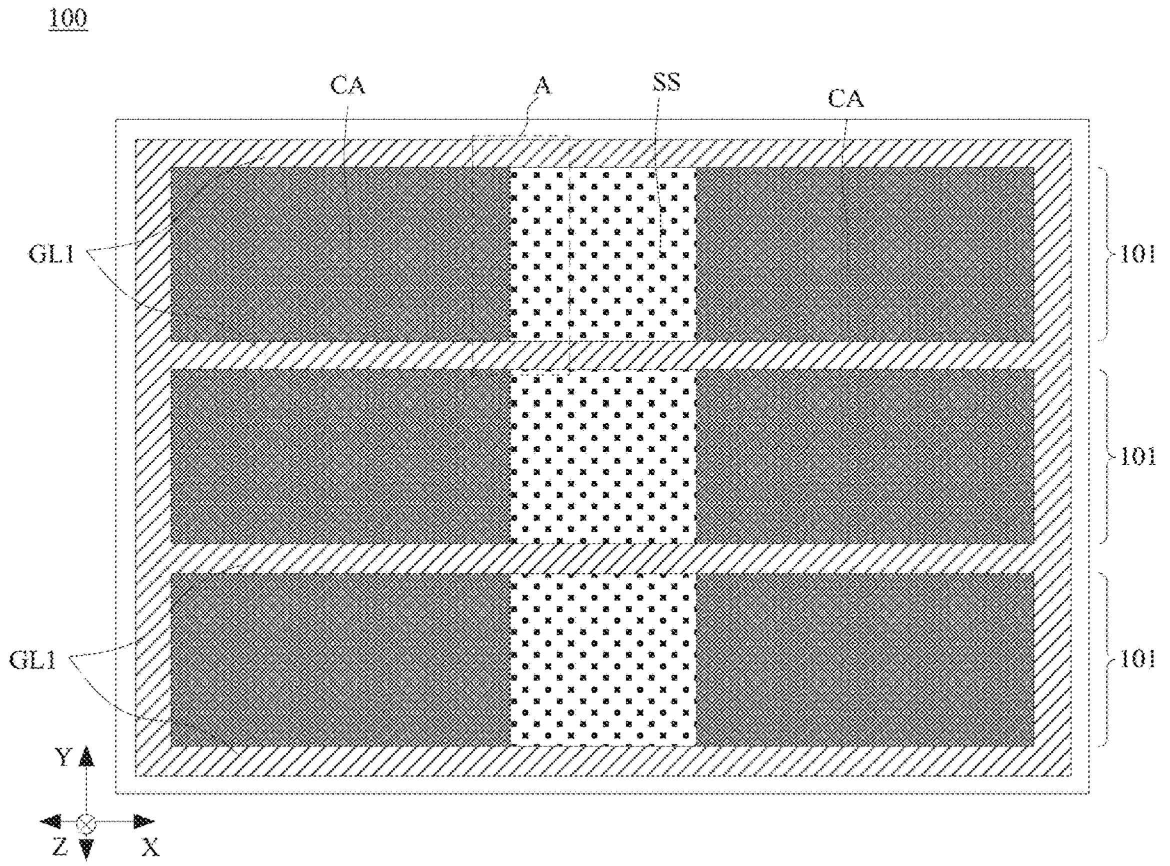
FIG. 4 is a top view of a semiconductor structure according to some embodiments.
Figure 5:
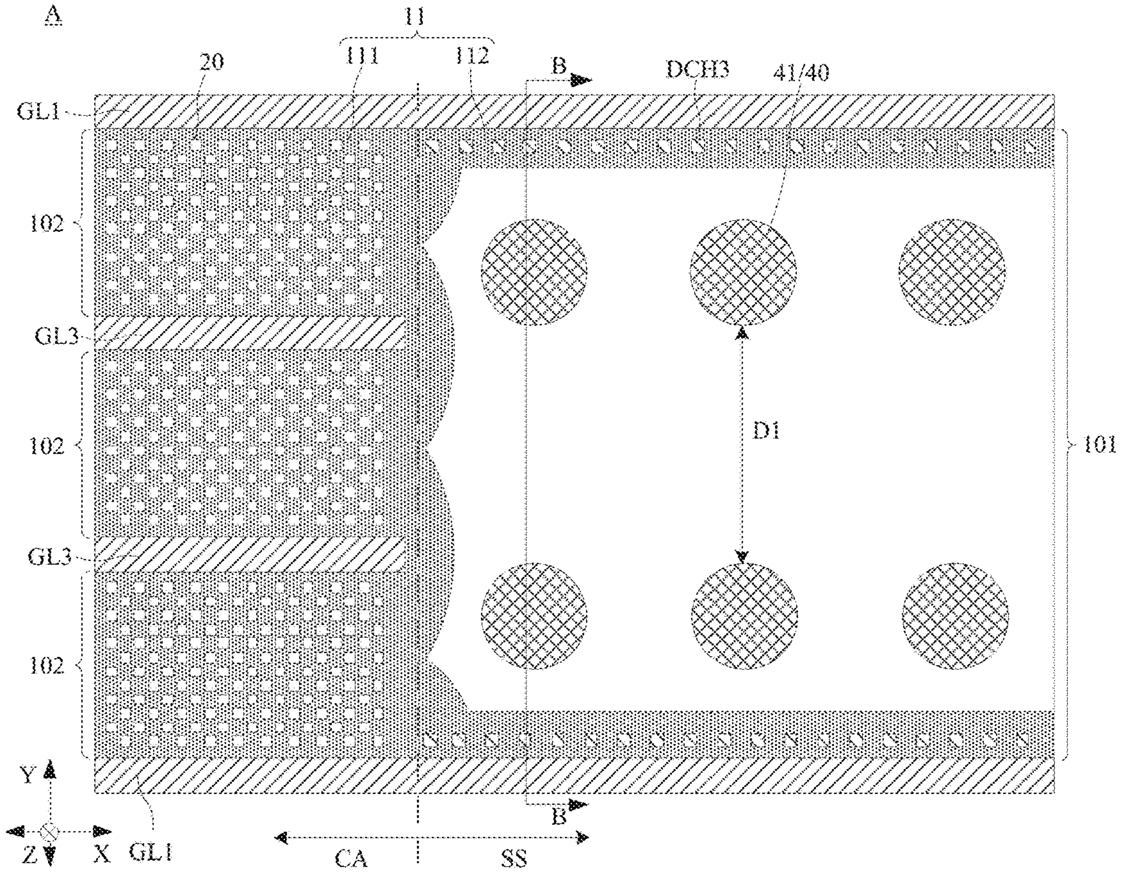
FIG. 5 is a partially enlarged diagram of the location A in FIG. 4.
Figure 6:
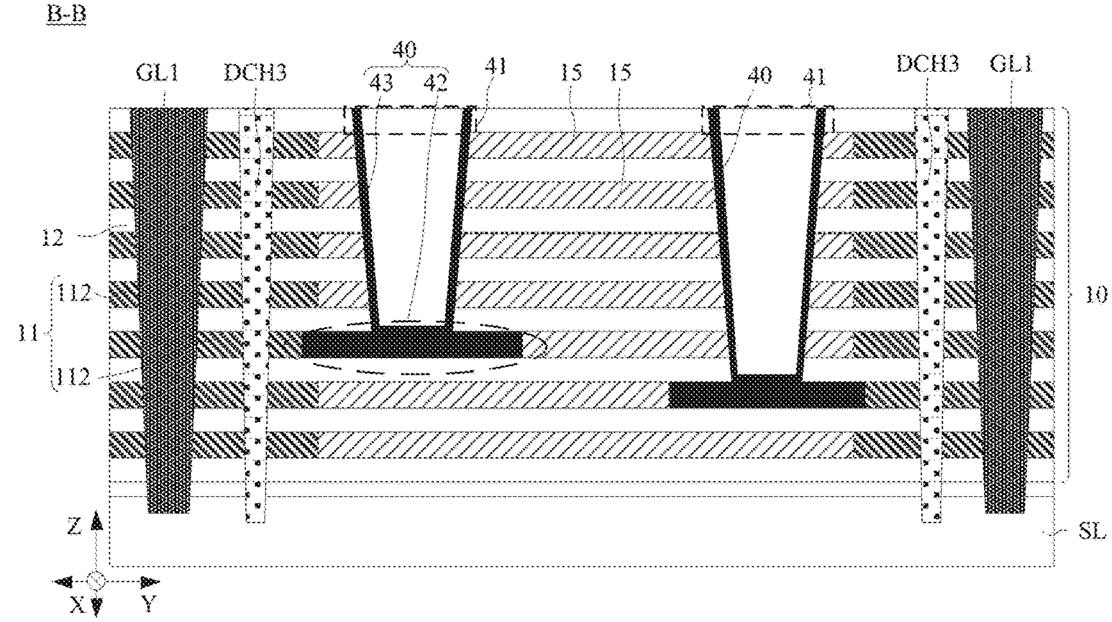
FIG. 6 is a sectional view along the sectional line B-B in FIG. 5.

In order to solve the above problem, some embodiments of the present disclosure provide a semiconductor structure 100, with reference to FIGS. 4, 5, and 6, the semiconductor structure 100 comprises a stack structure 10, a plurality of conductive structures 40 and a plurality of first gate isolation structures GL1.

FIG. 4 is a structure diagram of an upper surface (a surface far away from a source layer SL) of the semiconductor structure 100; FIG. 5 is a structure diagram of an upper surface of a block 101 in the semiconductor structure 100; and FIG. 6 is a sectional view of the block 101 along a second direction Y. It may be understood that FIG. 6 and the subsequent figures do not show the metal compound layer 13 and the fourth dielectric layer 14 between the gate layer 11 and first dielectric layer 12, which is merely used to simplify the views, but does not impose limitations to a structure of the semiconductor structure 100. In some embodiments, the metal compound layer 13 and the fourth dielectric layer 14 may be disposed between the gate layer 11 and the first dielectric layer 12.

As shown in FIG. 6, the above stack structure 10 may comprise a plurality of gate layers 11 and first dielectric layers 12 that are disposed in an overlapping stack-up manner.

The material of the gate layers 11 may include a conductive material, for example, one or more of tungsten, cobalt, copper, aluminum, doped silicon and silicide.

A material of the first dielectric layers 12 may include an insulating material including at least one of silicon oxide, silicon nitride, silicon oxynitride, doped silicon oxide, an organosilicate glass, a dielectric metal oxide (e.g., aluminum oxide, hafnium dioxide, etc.) and silicate thereof, and an organic insulating material.

The plurality of first gate isolation structures GL1 run through the stack structure 10, the first gate isolation structures GL1 extend along a first direction X, and the plurality of first gate isolation structures GL1 are arranged at intervals along a second direction Y. As such, the plurality of first gate isolation structures GL1 divide the stack structure 10 into at least one block 101. As an example, a region between every two adjacent first gate isolation structures GL1 is formed into one block 101; for example, as shown in FIG. 4, the semiconductor structure 100 comprises four first gate isolation structures GL1, which divide the semiconductor structure 100 into three blocks 101.

A material of the first gate isolation structures GL1 may include an insulating material, which may be, for example, at least one of silicon oxide, silicon nitride, silicon oxynitride, doped silicon oxide, an organosilicate glass, a dielectric metal oxide (e.g., aluminum oxide, hafnium dioxide, etc.) and silicate thereof, and an organic insulating material.

Each block 101 comprises a memory region CA and a connection region SS distributed along the first direction X. That is, the first direction X is an arrangement direction of the memory region CA and the connection region SS, and the second direction Y is perpendicular to the first direction X.

It may be understood that the connection region SS may be located between two adjacent memory regions CA. That is, the connection region SS is located in the middle of the semiconductor structure 100 along the first direction X (as shown in FIG. 4); alternatively, the connection regions SS may also be located on two sides of the memory region CA, that is, the connection regions SS are located at two ends of the semiconductor structure 100 along the first direction X (not shown in the figure), and the embodiments of the present disclosure do not impose specific limitations thereto.

It may be understood that the first gate isolation structure GL1 may separate each gate layer 11 into a plurality of word lines WL. As an example, one word line WL is disposed between two adjacent first gate isolation structures GL1. The number of the word lines WL comprised in the same gate layer 11 is the same as the number of the blocks 101 comprised in the semiconductor structure 100, every word line WL in the same gate layer 11 is located within one block 101, and the different word lines WL in the same gate layer 11 are located within different blocks 101.

The plurality of conductive structures 40 are located in the connection region SS; in the same block 101, each conductive structure 40 is electrically connected with one gate layer 11, and the different conductive structures 40 are electrically connected with the different gate layers 11; that is, each conductive structure 40 is electrically connected with one word line WL. As such, each conductive structure 40 is used to lead out one gate layer 11 (one word line WL) within one block 101.

It should be noted that unless otherwise stated, in the embodiments of the present disclosure, structures within one block 101 are described. That is, one or more components (e.g., layers, structures or devices), when described, refer to respective components within the same block 101. For example, “a plurality of conductive structures 40”, when described, refers to a plurality of conductive structures within the same block 101; for another example, “two adjacent conductive structures 40”, when described, refer to two adjacent conductive structures 40 within the same block 101.

Upper ends 41 of any two adjacent conductive structures 40 have a spacing therebetween to reduce risk of a short circuit between the adjacent conductive structures 40. As shown in FIG. 5, orthographic projections of the upper ends 41 (ends of the conductive structures 40 far away from the semiconductor layer SL) of the at least two conductive structures 40 on a reference plane X-Z at least partially overlap, and for example, may partially overlap, or completely overlap. That is, at least portions of the upper ends 41 of the at least two conductive structures 40 are disposed in juxtaposition along the second direction Y; in this way, the upper ends 41 of the at least two conductive structures 40 share a space of the connection region SS in the first direction X, thereby facilitating to decrease a size of the connection region SS along the first direction X. In the event that the sizes of the memory region CA and the connection region SS are approximately the same along the second direction Y, an area proportion of the connection region SS in the semiconductor structure 100 on an X-Y plane can be decreased by reducing the size of the connection region SS along the first direction X, thereby increasing an area proportion of the memory region CA on the X-Y plane, improving the memory density of the semiconductor structure 100 and improving the memory density of the three-dimensional memory 1000.

Here, the above reference plane is perpendicular to the second direction Y. That is, the reference plane is an X-Z plane.

It should be noted that, the upper end 41 of the conductive structure 40 refers to the end of the conductive structure 40 far away from the semiconductor layer SL; as shown in FIG. 6, for example, the upper end 41 may refer to a portion of the conductive structure 40 running through the topmost first dielectric layer 12, that is, the upper end 41 is a portion of the conductive structure 40 above a plane where the lower surface of the topmost first dielectric layer 12 is located; the lower surface of the upper end 41 may be flush with the lower surface of the topmost first dielectric layer 12; and the upper surface of the upper end 41 may be flush with the upper surface of the topmost first dielectric layer 12. The upper end 41 may further comprise a portion above a plane where the upper surface of the topmost first dielectric layer 12 is located, for example, a liner connected with the portion of the conductive structure 40 running through the topmost dielectric layer 12.

In some embodiments, the above conductive structures 40 employ an SCT architecture. As shown in FIG. 6, the conductive structure 40 may comprise a first portion 42 and a second portion 43, and the first portion 42 is disposed in the same layer as the gate layer 11 and electrically connected with the gate layer 11. The second portion 43 is connected with the first portion 42, and runs through the stack structure 10 upwards (along a third direction Z and a direction far away from the semiconductor layer SL). An orthographic projection of the second portion 43 on the first portion 42 is located within extent of the first portion 42.

In the event that the conductive structures 40 employ the SCT architecture, as shown in FIGS. 5 and 6, the gate layer 11 comprises a body portion 111 in the memory region CA, and second conductive pathways 112 on two sides of the first gate isolation structure GL1, and the second conductive pathways 112 extend along the first direction X and are electrically connected with the body portion 111.

It may be understood that the uppermost film layer of the stack structure 10 may be the first dielectric layer 12. In FIG. 5 and the subsequent top views of the semiconductor structure 100, shadow portions in the figures denote regions where the gate layers 11 are located, but this does not represent that the top layer of the stack structure 10 is the gate layer 11.

The stack structure 10 further comprises dielectric patterns 15 which are located in the connection region SS, each dielectric pattern 15 is disposed in the same layer as one gate layer 11, and the dielectric pattern 15 is located between two second conductive pathways 112.

The conductive structure 40 is electrically connected with the second conductive pathway 112; particularly, a part of the first portion 42 of the conductive structure 40 close to the first gate isolation structure GL1 is electrically connected with the second conductive pathway 112 close to the first portion 42; in this way, the conductive structure 40 may be electrically connected with the body portion 111 through the second conductive pathway 112 to implement a signal transfer between the conductive structure 40 and the body portion 111.

It should be noted that the upper ends 41 of the conductive structures 40 may be round, square, rectangular, oval or in any other shape, and the embodiments of the present disclosure do not impose specific limitations thereto. On this basis, in the figures provided by the embodiments of the present disclosure, the shapes of the upper ends 41 of the conductive structures 40 should not be interpreted as limitations to the conductive structures 40.

In some embodiments, referring to FIG. 5, the plurality of conductive structures 40 (within the same block 101) are arranged in multiple columns, and each column comprises at least two conductive structures 40 distributed at intervals along the second direction Y. Orthographic projections of the upper ends 41 of the at least two conductive structures 40 of the same column on the reference plane X-Z overlap, that is, the orthographic projections of all the conductive structures 40 comprised in the same column of conductive structures 40 on the reference plane X-Z overlap. As such, a space occupied by the same column of conductive structures 40 in the first direction X may be reduced to the greatest extent, the size of the connection region SS along the first direction X is decreased to the greatest extent, the area proportion of the connection region SS is reduced, and the memory density of the semiconductor structure 100 is improved.

As an example, the upper ends 41 of the plurality of conductive structures 40 are the same in size and shape. That is, during the formation of the conductive structures 40, openings of masks used by different conductive structures 40 are the same in size and shape. As such, the orthographic projections of the upper ends 41 of the at least two conductive structures 40 of the same column on the reference plane X-Z overlap completely.

It may be understood that, the different conductive structures 40 are electrically connected with the different gate layers 11, and are different in size along the third direction Z; on this basis, parts of the orthographic projections of the conductive structures 40 of the same column on the reference plane X-Z overlap, and other parts of the orthographic projections do not overlap. However, the orthographic projections of the upper ends 41 of the at least two conductive structures 40 of the same column on the reference plane X-Z overlap completely since the upper ends 41 of the at least two conductive structures 40 of the same column are the same in size and shape. It may also be understood that, during the fabrication and formation of the conductive structures 40, orthographic projections of the openings of the masks for forming the two conductive structures 40 of the same column on the reference plane X-Z overlap completely.

The embodiments of the present disclosure are shown by taking each column of conductive structures 40 including two conductive structures 40 disposed at an interval along the second direction Y as an example, but the number of the conductive structures 40 comprised in each column may also be three or more, which is not repeated anymore here. Here, in one column of the conductive structures 40, the two outermost conductive structures 40 along the second direction Y may be electrically connected with the body portions 111 of the gate layers 11 through the second conductive pathways 112 close to the two outermost conductive structures 40.

Figure 7:
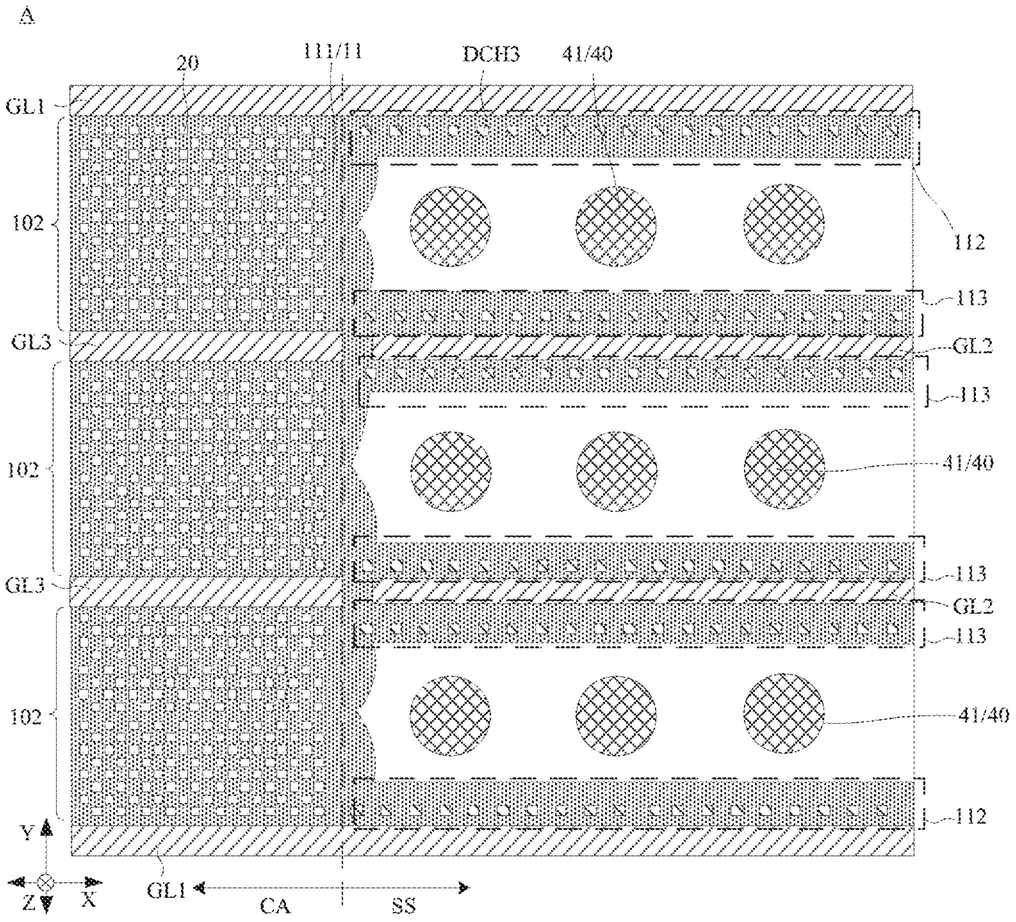
FIG. 7 is another partially enlarged diagram of the location A in FIG. 4.

Referring to FIG. 7, when the number of conductive structures 40 of one column exceeds two, a second gate isolation structure GL2 may be formed between two adjacent rows of conductive structures 40, and first conductive pathways 113 are formed on two sides of the second gate isolation structure GL2, and the middle conductive structures (all the conductive structures except for the two outermost conductive structures 40) in one column may be electrically connected with the body portions 111 of the gate layers 11 through the first conductive pathways 113, thereby implementing a signal transfer between the conductive structures 40 and the body portions 111 of the gate layers 11.

In some embodiments, referring to FIG. 5, a spacing D1 between the upper ends 41 of two adjacent conductive structures 40 of the same column is greater than or equal to 500 nm. As such, the risk of a short circuit between the two adjacent conductive structures 40 may be reduced, and particularly, the risk of a short circuit between the first portions 42 of the conductive structures 40 and the second portions 43 of the adjacent conductive structures 40 is reduced.

As an example, the spacing D1 between the upper ends 41 of the two adjacent conductive structures 40 of the same column may be 500 nm, 650 nm, 700 nm, etc., which is not enumerated anymore in the embodiments of the present disclosure. Of course, on the premise that a mutual insulation between the adjacent conductive structures 40 can be permitted and ensured by a process, the spacing D1 between the upper ends 41 of the adjacent conductive structures 40 may be adjusted adaptively.

In some embodiments, the plurality of conductive structures 40 in the same block 101 are arranged in at least two rows, and each row includes at least two conductive structures 40 disposed at intervals along the first direction X. That is, the orthographic projections of the upper ends 41 of the plurality of conductive structures 40 comprised in one row of conductive structures 40 on the Y-Z plane overlap, thereby facilitating to decrease the size of the connection region SS along the second direction Y, further reducing the area proportion of the connection region SS in the semiconductor structure 100 and improving the memory density of the three-dimensional memory 1000.

Figure 8:
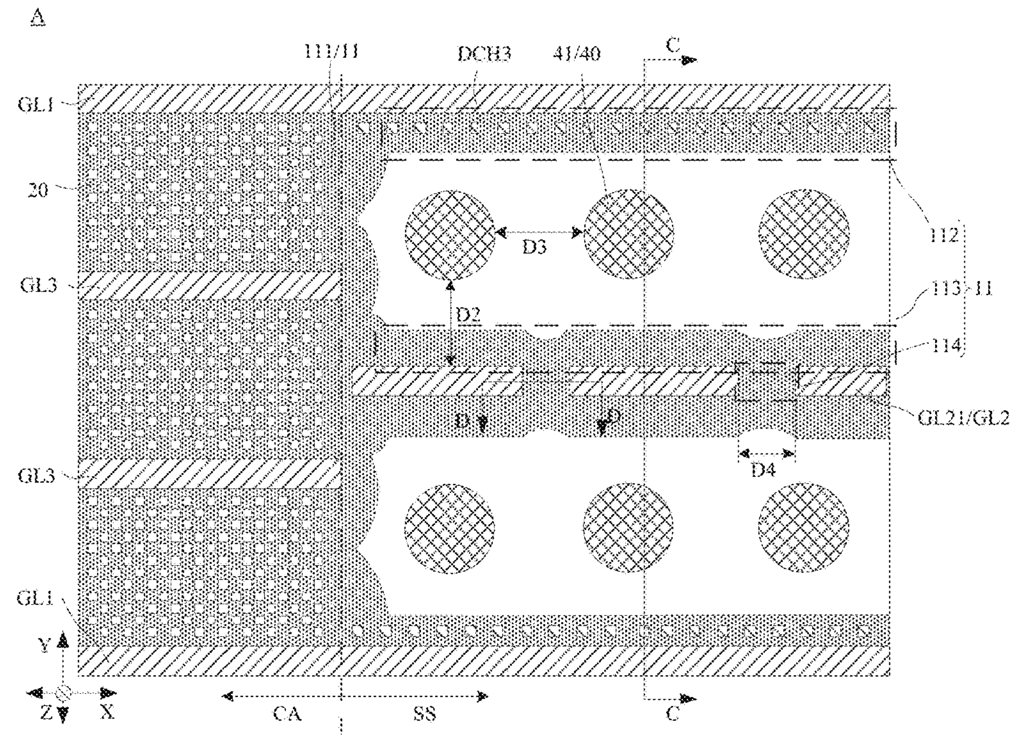
FIG. 8 is yet another partially enlarged diagram of the location A in FIG. 4.
Figure 9:
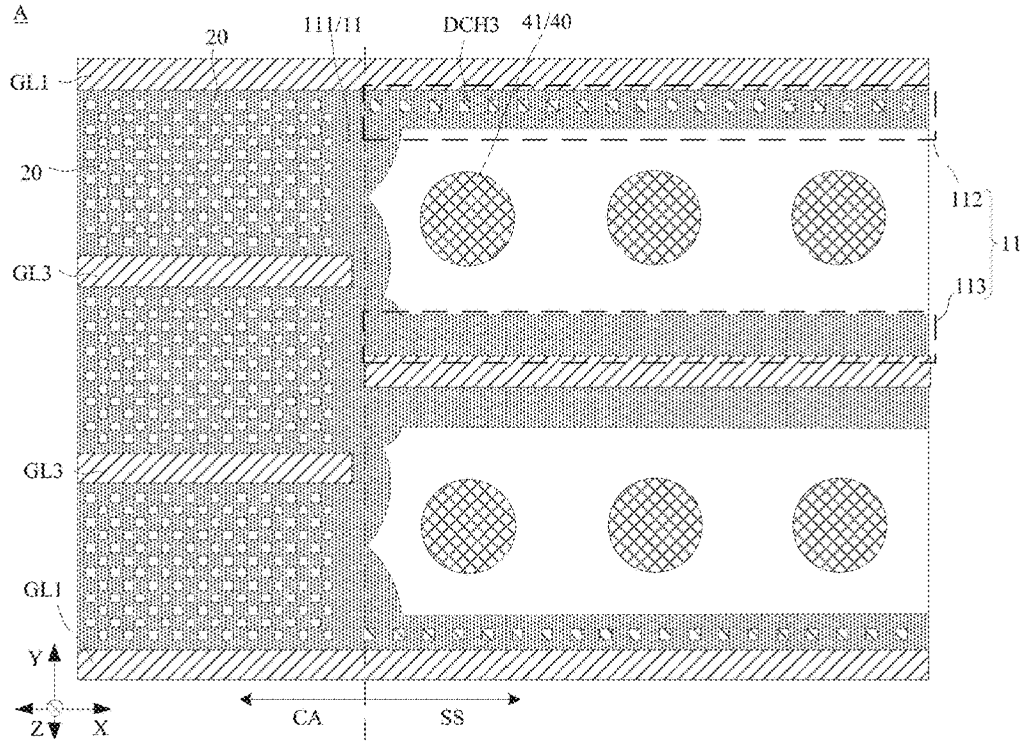
FIG. 9 is yet another partially enlarged diagram of the location A in FIG. 4.

Referring to FIGS. 8 and 9, FIG. 8 is a top view of the semiconductor structure 100 when the second gate isolation structure GL2 comprises a plurality of second isolation substructures GL21, and FIG. 9 is a top view of the semiconductor structure 100 when the second gate isolation structure GL2 runs through the connection region SS along the first direction X.

The semiconductor structure 100 further comprises a second gate isolation structure GL2. As shown in FIGS. 8 and 9, the second gate isolation structure GL2 is located between two adjacent rows of the conductive structures 40, runs through the stack structure 10 along the third direction Z, and extends along the first direction X. There is a spacing between the second gate isolation structure GL2 and each of the two adjacent rows of conductive structures 40 to enable the first conductive pathways 113 to be formed between the second gate isolation structure GL2 and the conductive structures 40.

Figure 10:
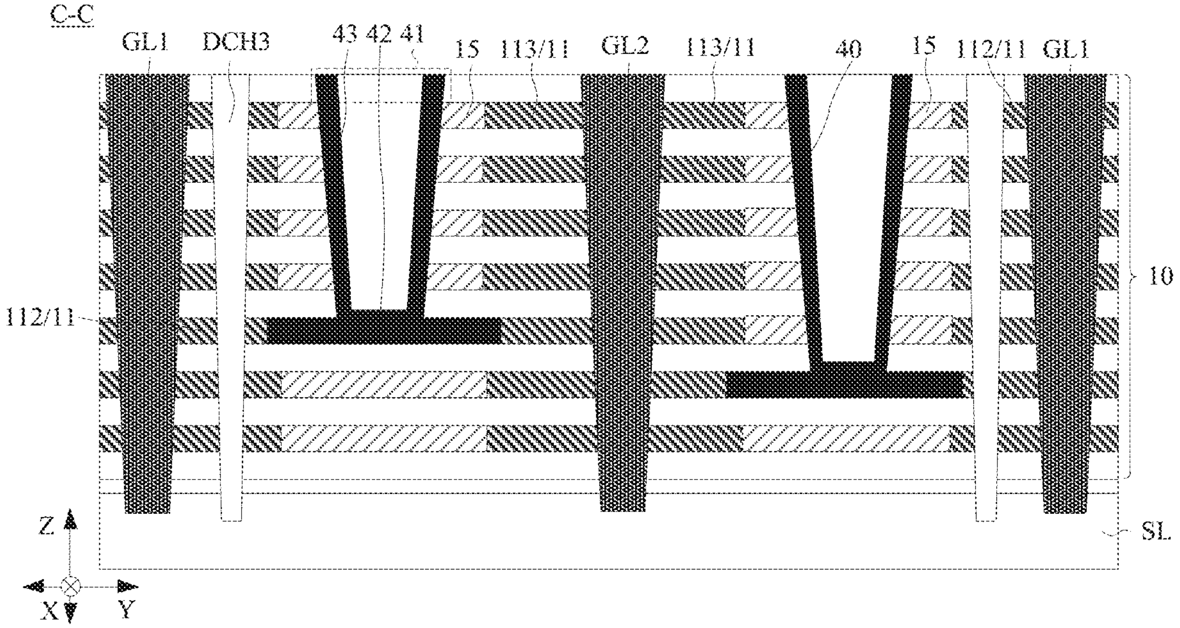
FIG. 10 is a sectional view along the sectional line C-C in FIG. 8.

Referring to FIGS. 8 and 10, the gate layer 11 further comprises the first conductive pathways 113 on the two sides of the second gate isolation structure GL2, and the first conductive pathways 113 run through the connection region SS along the first direction X and are electrically connected with the body portion 111. The first portion 42 of the conductive structure 40 is further electrically connected with the first conductive pathways 113, and is connected with the body portion 111 of the gate layer 11 through the first conductive pathways 113 and the second conductive pathways 112, thereby reducing the risk of connection failure between the conductive structure 40 and the gate layer 11 and improving connection reliability between the conductive structure 40 and the gate layer 11.

In some embodiments, as shown in FIG. 8, spacing D2 between the second gate isolation structure GL2 and the upper ends 41 of two adjacent rows of the conductive structures 40 is greater than or equal to 600 nm, thereby facilitating to increase the sizes of the first conductive pathways 113 along the second direction Y and reducing resistance of the first conductive pathways 113. As an example, the spacing D2 between the second gate isolation structure GL2 and the upper ends 41 of the conductive structures 40 is 600 nm, 750 nm, or 800 nm, or the like, which is not enumerated anymore here in the embodiments of the present disclosure.

As shown in FIG. 8, along the first direction X, a spacing D3 between the upper ends 41 of the two adjacent conductive structures 40 is greater than or equal to 500 nm. As such, the risk of a short circuit between the two adjacent conductive structures 40 along the first direction X can be reduced. As an example, along the first direction X, the spacing D3 between the upper ends 41 of the two adjacent conductive structures 40 is 500 nm, 550 nm, or 600 nm.

It may be understood that, on the premise of ensuring an insulation between the two adjacent conductive structures 40 in the first direction X, a size of the spacing D3 between the two adjacent conductive structures 40 may be decreased as much as possible, thereby decreasing the size of the connection region SS along the first direction X, reducing the area proportion of the connection region SS in the semiconductor structure 100 and improving the memory density of the three-dimensional memory 1000.

The above second gate isolation structure GL2 may run through the connection region SS along the first direction X (as shown in FIG. 9), or the second gate isolation structure GL2 may comprise a plurality of second isolation substructures GL21 (as shown in FIG. 8), the second isolation substructures GL21 extend along the first direction X, and the two adjacent second isolation substructures GL21 have a spacing D4 therebetween.

Referring to FIG. 9, the second gate isolation structure GL2 runs through the connection region SS along the first direction X, thereby facilitating to simplify the structure of the second gate isolation structure GL2, reducing the fabrication difficulty of the second gate isolation structure GL2, and in turn reducing the fabrication difficulty of the three-dimensional memory.

Figure 11:
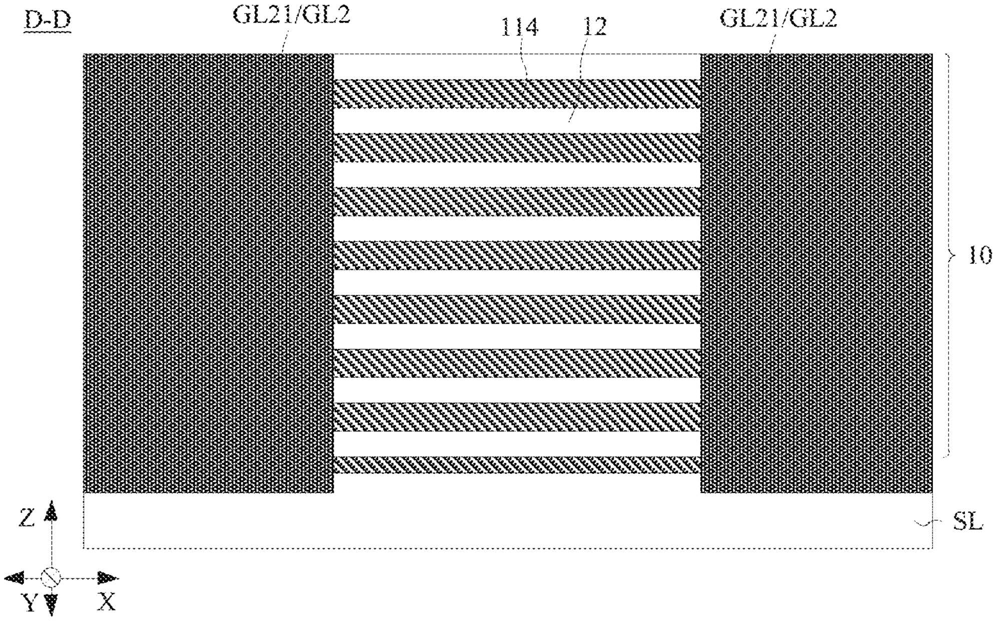
FIG. 11 is a sectional view along the sectional line D-D in FIG. 8.

Referring to FIGS. 8 and 11, the second gate isolation structure GL2 comprises a plurality of second isolation substructures GL21. As such, the gate layer 11 further comprises a connection portion 114 between two adjacent second isolation substructures GL21, and the connection portion 114 is electrically connected with the two first conductive pathways 113 on the two sides of the second gate isolation structure GL2. The two first conductive pathways 113 on the two sides of the second gate isolation structure GL2 may be connected, thereby reducing the resistance of the first conductive pathways 113.

In some embodiments, as shown in FIG. 8, along the first direction X, the spacing D4 between the upper ends of the two adjacent second isolation substructures GL21 is less than or equal to 600 nm. As such, the risk of breaking the first conductive pathways 113 can be reduced at the space between two adjacent second isolation substructures GL21, so that the first conductive pathways 113 can run through the connection region SS along the first direction X, thereby improving the reliability of the first conductive pathways 113. As an example, the spacing D4 between the upper ends of the two adjacent second isolation substructure GL21 may be 600 nm, 500 nm, 350 nm, etc., which is not enumerated anymore in the embodiments of the present disclosure.

Figure 12:
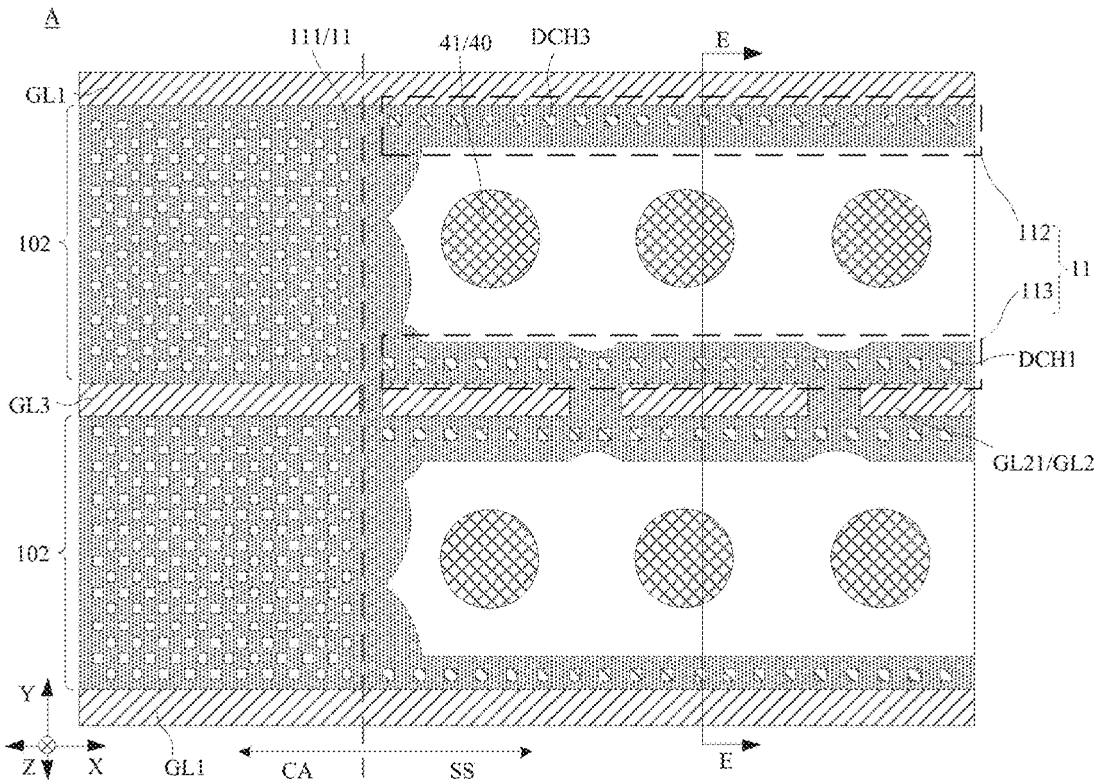
FIG. 12 is yet another partially enlarged diagram of the location A in FIG. 4.
Figure 13:
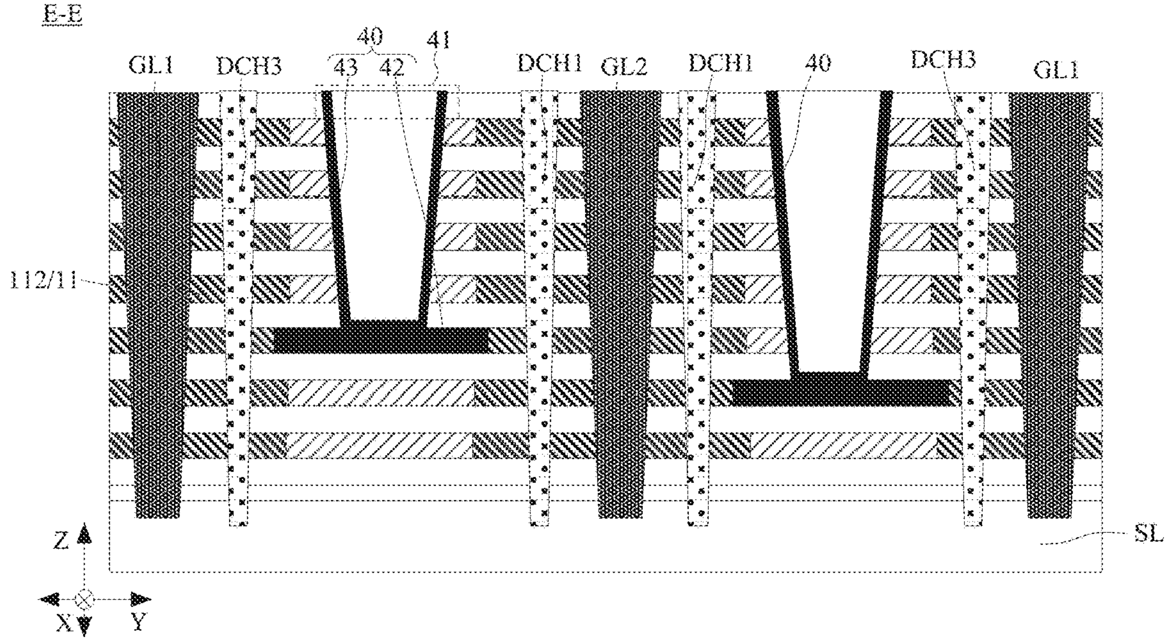
FIG. 13 is a sectional view along the sectional line E-E in FIG. 12.

In some embodiments, referring to FIGS. 12 and 13, the semiconductor structure 100 further comprises a plurality of first dummy channel structures DCH1. The plurality of first dummy channel structures DCH1 are located between the second gate isolation structure GL2 and each of two adjacent rows of the conductive structures 40. The first dummy channel structures DCH1 run through the stack structure 10 along the third direction Z. The first dummy channel structures DCH1 function to provide mechanical support for the semiconductor structure 100, can improve structural strength of the connection region SS, and reduce the risk of deformation of the connection region SS.

As an example, the plurality of first dummy channel structures DCH1 are arranged in two rows, each row of the first dummy channel structures DCH1 comprises multiple first dummy channel structures DCH1 distributed along the first direction X, and two rows of the first dummy channel structures DCH1 are located on two sides of the second gate isolation structure GL2 respectively.

As an example, the first dummy channel structures DCH1 may comprise an insulating material, which may be, for example, at least one of silicon oxide, silicon nitride, silicon oxynitride, doped silicon oxide, an organosilicate glass, a dielectric metal oxide (e.g., aluminum oxide, hafnium dioxide, etc.) and silicate thereof, and an organic insulating material.

Figure 15:
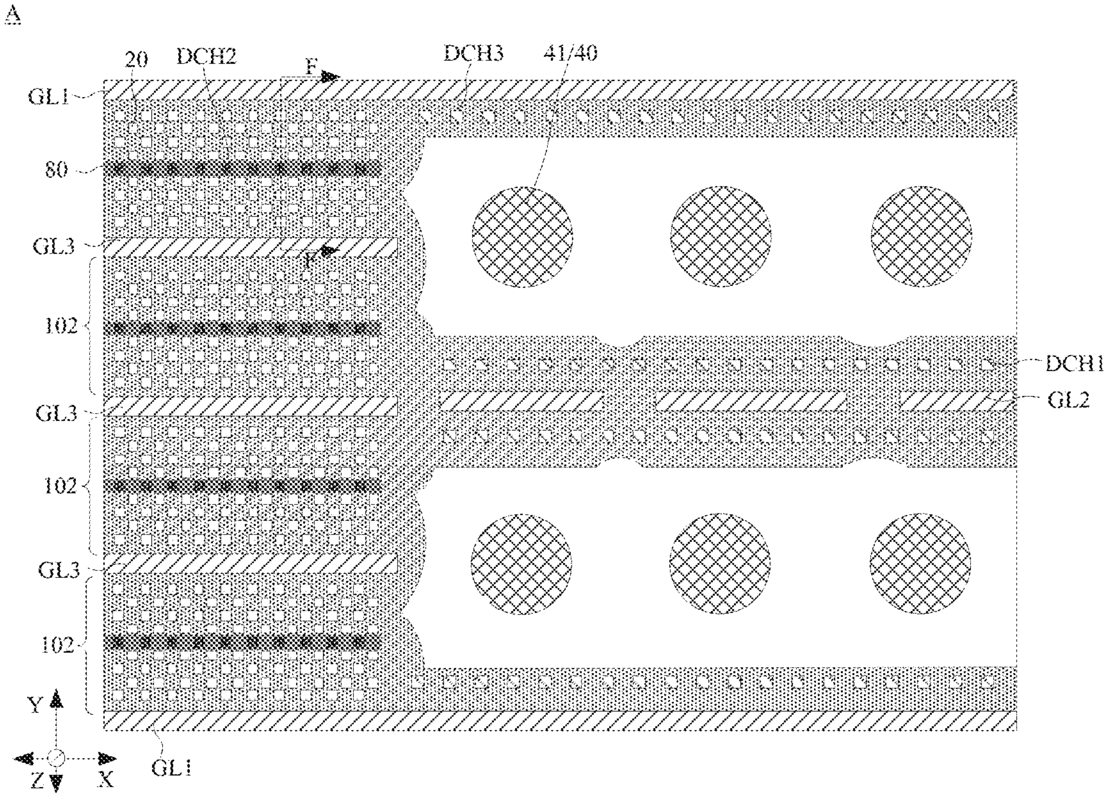
FIG. 15 is yet another partially enlarged diagram of the location A in FIG. 4.

In some embodiments, as shown in FIGS. 12 and 15, the semiconductor structure 100 further comprises at least one third gate isolation structure GL3. The at least one third gate isolation structure GL3 is located in the memory region CA, runs through the stack structure 10 along the third direction Z, and extends along the first direction X.

The at least one third gate isolation structure GL3 divides the memory region CA into at least two memory fingers 102. As an example, the semiconductor structure 100 may comprise one third gate isolation structure GL3 (as shown in FIG. 12) or two third gate isolation structures GL3 (as shown in FIG. 15). One memory finger 102 is formed between two adjacent third gate isolation structures GL3, and the memory fingers 102 are formed between the third gate isolation structures GL3 and the adjacent first gate isolation structures GL1.

As shown in FIG. 12, there is a spacing between the second gate isolation structure GL2 and the third gate isolation structures GL3 to enable the first conductive pathways 113 formed on the two sides of the second gate isolation structure GL2 to be electrically connected with the body portion 111 within the memory region CA, thereby ensuring that the conductive structure 40 can be electrically connected with portions of the gate layer 11 within the different memory fingers 102.

As shown in FIGS. 12 and 15, the plurality of memory channel structures 20 comprised in the semiconductor structure 100 are located within the memory fingers 102 and are arranged in multiple rows. Each memory finger 102 comprises 4N rows of channel structures, where N is an integer greater than or equal to 2. As an example, N may be 2, 3, or 4, or the like, that is, each memory finger 102 may comprise 8, 12 or 16 rows of memory channel structures 20. The structures of the memory channel structures 20 are as described above, which are not repeated here anymore.

In some embodiments, the semiconductor structure 100 further comprises a top select gate (TSG) SGD. As an example, a select gate stack structure 50 may be formed on a side of the stack structure 10 far away from the semiconductor layer SL using a TSG Deck process, and the top select gate SGD is formed through the select gate stack structure 50.

Figure 14:
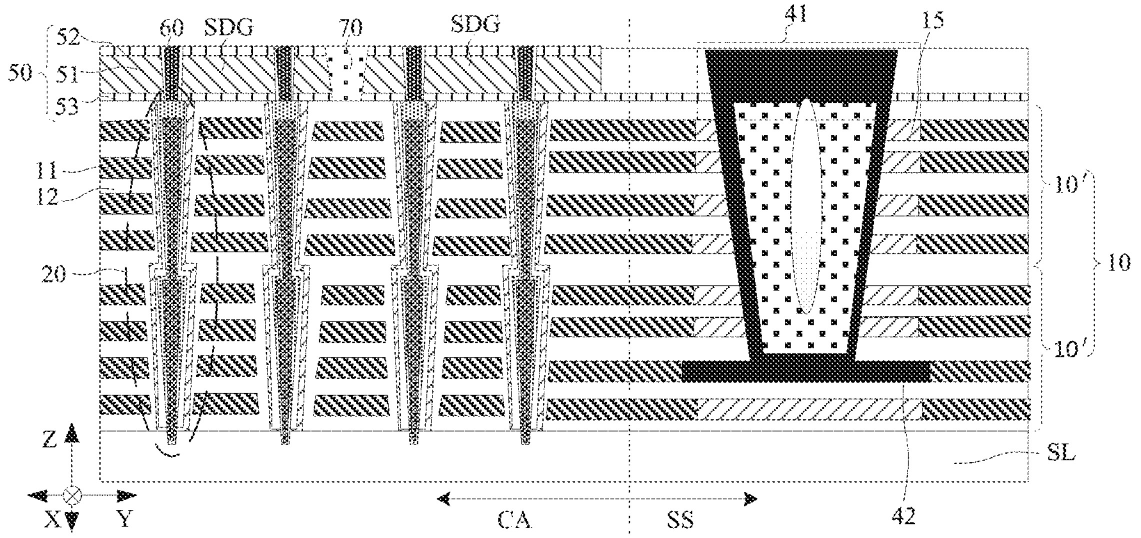
FIG. 14 is a sectional structural diagram of a semiconductor structure according to some embodiments.

As shown in FIG. 14, the semiconductor structure 100 further comprises a select gate stack structure 50, a plurality of semiconductor contact pillars 60, and at least one separation structure 70.

The select gate stack structure 50 is disposed on the stack structure 10. As an example, as shown in FIG. 14, the select gate stack structure 50 may be disposed on a side of the stack structure 10 far away from the semiconductor layer SL. The select gate stack structure 50 comprises a conductor layer 51 and a second dielectric layer 52 that are disposed in a stack-up manner, and the conductor layer 51 is closer to the stack structure 10 as compared with the second dielectric layer 52. Of course, a fifth dielectric layer 53 may be further disposed between the conductor layer 51 and the stack structure 10.

As an example, the second dielectric layer 52 may be disposed in the memory region CA and the connection region SS, and the conductor layer 51 is only disposed in the memory region CA. A material of the conductor layer 51 may comprise a conductive material, which may be, for example, polysilicon. Materials of the second dielectric layer 52 and the fifth dielectric layer 53 may comprise an insulating material. For example, the material of the second dielectric layer 52 may be silicon nitride, and the material of the fifth dielectric layer 53 may be silicon oxide.

The plurality of semiconductor contact pillars 60 run through the select gate stack structure 50, and one semiconductor contact pillar 60 is electrically connected with one memory channel structure 20. The material of the semiconductor contact pillars 60 may comprise a semiconductor material, which may include, for example, polysilicon.

The separation structure 70 extends along the first direction X, and runs through the select gate stack structure 50 along the third direction Z to separate the conductor layer 51.

In some embodiments, in the event that the semiconductor structure 100 further comprises the select gate stack structure 50, as shown in FIGS. 7 and 8, each block 101 may comprise three memory fingers 102, and each memory finger 102 comprises twelve or sixteen rows of memory channel structures 20, thereby increasing the memory density of the memory region CA to the greatest extent.

Figure 16:
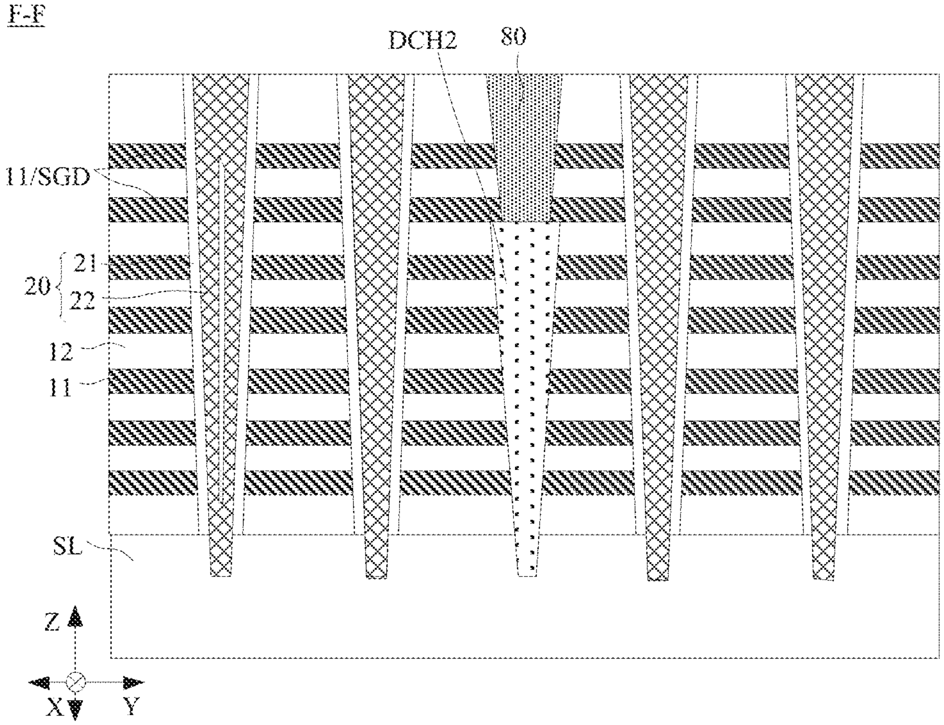
FIG. 16 is a sectional view along the sectional line F-F in FIG. 15.

In some other embodiments, as shown in FIGS. 15 and 16, a top select gate cut (TSG CUT) is formed at the top of the stack structure 10, and an insulating material is filled within the top select gate cut to form a top select gate cut structure 80. The top select gate cut structure 80 separates part of the gate layers 11 in the stack structure 10 far away from the semiconductor layer SL to form the top select gate SGD.

As shown in FIGS. 15 and 16, the semiconductor structure 100 further comprises at least one row of second dummy channel structures DCH2, and at least one top select gate cut structure 80.

At least one row of the second dummy channel structures DCH2 is located in the memory region CA and located between two adjacent rows of the memory channel structures 20. As an example, there is a spacing between the upper ends of the second dummy channel structures DCH2 and at least one gate layer 11.

The at least one top select gate cut structure 80 runs through the at least one gate layer 11 at the top of the stack structure 10 (the top select gate cut structure 80 running through two gate layers 11 at the top of the stack structure 10, as exemplarily shown in FIG. 16), and an orthographic projection of one top select gate cut structure 80 on the lower surface of the stack structure 10 at least partially overlaps with an orthographic projection of one row of the second dummy channel structures DCH2 on the lower surface of the stack structure 10. Here, the lower surface of the stack structure 10 refers to the surface of the stack structure 10 close to the semiconductor layer SL and parallel to the X-Y plane.

As an example, the top select gate cut structure 80 may comprise an insulating material, which may be, for example, silicon oxide. The lower end of the top select gate cut structure 80 may contact the upper end of dummy channel structure DCH2.

As shown in FIG. 15, in the event that the semiconductor structure 100 further comprises at least one row of second dummy channel structures DCH2 and at least one top select gate cut structure 80, each block 101 may comprise four memory fingers 102, and each memory finger 102 comprises eight rows of memory channel structures 20 and one row of second dummy channel structures DCH2. Along the second direction Y, four rows of memory channel structures 20 are disposed on each of two sides of one row of second dummy channel structures DCH2. That is, the second dummy channel structures DCH2 may be located in the middle of the memory finger 102 along the second direction; as such, the memory density of the memory region CA may be improved to the greatest extent.

In some embodiments, the semiconductor structure 100 may further comprise a plurality of third dummy channel structures DCH3 which are arranged in multiple rows, and each row includes multiple third dummy channel structures DCH3 disposed along the first direction X. The third dummy channel structures DCH3 may be disposed on two sides of the first gate isolation structure GL1 along the second direction Y. That is, one row of third dummy channel structures DCH3 may be disposed on each of two sides of the first gate isolation structure GL1 along the second direction Y.

In some embodiments, with the increase in the number of the gate layers 11 and the first dielectric layers 12 comprised in the stack structure 10, the stack structure 10 may comprise a plurality of stack substructures 10'. As an example, as shown in FIG. 14, the stack structure 10 may comprise two stack substructures 10', and the embodiments of the present disclosure do not impose specific limitations thereto.

Figure 17:
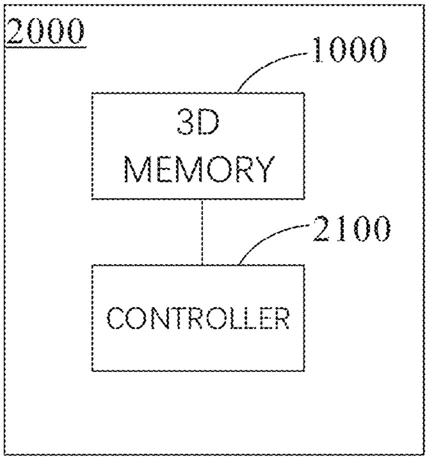
FIG. 17 is a block diagram of a memory system according to some embodiments.
Figure 18:
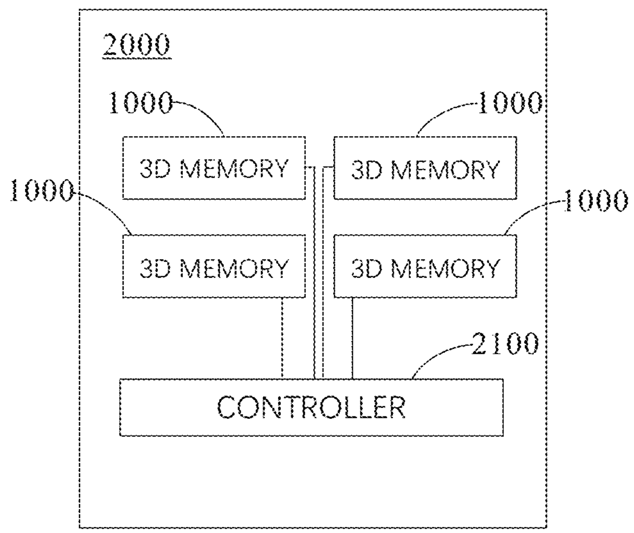
FIG. 18 is a block diagram of a memory system according to some other embodiments.

FIG. 17 is a block diagram of a memory system according to some embodiments. FIG. 18 is a block diagram of a memory system according to some other embodiments.

Some embodiments of the present disclosure further provide a memory system 2000. As shown in FIGS. 17 and 18, the memory system 2000 comprises a controller 2100, and the three-dimensional memory 1000 of some of the above embodiments. The controller 2100 is coupled to the three-dimensional memory 1000 for controlling the three-dimensional memory 1000 to store data.

Here, the memory system 2000 may be integrated into various types of memory devices, for example, included in the same package (e.g., a Universal Flash Storage (UFS) package or an Embedded Multi Media Card (eMMC) package). That is, the memory system 2000 may be applied to and packaged into different types of electronic products, such as, a mobile phone (e.g., a cellphone), a desktop computer, a tablet, a notebook, a server, a vehicle-mounted device, a gaming console, a printer, a positioning device, a wearable device, a smart sensor, a mobile power bank, a virtual reality (simply as VR) device, an augmented reality (simply as AR) device, or any other suitable electronic devices with a storage therein.

In some embodiments, as shown in FIG. 17, the memory system 2000 comprises a controller 2100, and a three-dimensional memory 1000, and may be integrated into a three-dimensional memory card.

Here, the three-dimensional memory card includes any one of a PC card (PCMCIA, Personal Computer Memory Card International Association), a compact flash (simply as CF) card, a smart media (simply as SM) card, a three-dimensional memory, a multimedia card (simply as MMC), a secure digital memory card (simply as SD), and UFS.

In some other embodiments, as shown in FIG. 18, the memory system 2000 comprises a controller 2100, and a plurality of three-dimensional memories 1000, and is integrated into a solid-state drive (simply SSD).

In the memory system 2000, in some embodiments, the controller 2100 is configured to operate in a low duty cycle environment, such as an SD card, a CF card, a Universal Serial Bus (simply as USB) flash drive, and other media used in electronic devices such as personal computers, digital cameras, mobile phones and the like.

In some other embodiments, the controller 2100 is configured to operate in a high duty cycle environment SSD or eMMC, and the SSD or eMMC is used for data storage of mobile devices, such as smartphones, tablets, notebooks and the like, and enterprise memory arrays.

In some embodiments, the controller 2100 may be configured to manage data stored in the three-dimensional memory 1000 and communicate with an external device (such as a host). In some embodiments, the controller 2100 may also be configured to control operations, for example, reading, erasing and programming operations, of the three-dimensional memory 1000. In some embodiments, the controller 2100 may be further configured to manage various functions with respect to data stored or to be stored in the three-dimensional memory 1000, including at least one of bad block management, garbage collection, logic to physical address conversion, and wear leveling. In some embodiments, the controller 2100 is further configured to process an error correction code with respect to data read from or written to the three-dimensional memory 1000.

Of course, the controller 2100 may also perform any other suitable functions, for example, formatting the three-dimensional memory 1000; for example, the controller 2100 may communicate with an external device (for example, a host) through at least one of various interface protocols.

It should be noted that the interface protocols include at least one of a USB protocol, an MMC protocol, a Peripheral Component Interconnect (PCI) protocol, a PCI-Express (PCI-E) protocol, an Advanced Technology Attachment (ATA) protocol, a serial ATA protocol, a parallel ATA protocol, a Small Computer Small Interface (SCSI) protocol, an Enhanced Small Disk Interface (ESDI) protocol, an Integrated Drive Electronics (IDE) protocol and a Firewire protocol.

Some embodiments of the present disclosure further provide an electronic device. The electronic device may be any one of a cellphone, a desktop computer, a tablet, a notebook, a server, a vehicle-mounted device, a wearable device (e.g., a smart watch, a smart bracelet, smart glasses, etc.), a mobile power bank, a gaming machine, a digital multimedia player and the like.

The electronic device may comprise the memory system 2000 as described above, and may further comprise at least one of a CPU (Central Processing Unit) and a cache, etc.

Only the specific implementations of the present disclosure have been described above, and the protection scope of the present disclosure is not limited thereto. Any variation or replacement readily figured out by those skilled in the art within the technical scope as disclosed by the present disclosure shall fall within the protection scope of the present disclosure. Therefore, the protection scope of the present disclosure shall be defined by the protection scope of the claims.

What is claimed is:

1. A semiconductor structure, comprising:

a stack structure comprising gate layers and first dielectric layers disposed alternately;

first gate isolation structures extending along a first direction and arranged at intervals along a second direction, first gate isolation structures dividing the stack structure into at least one block comprising a memory region and a connection region that are distributed along the first direction, the first direction being perpendicular to the second direction; and conductive structures in the connection region, each conductive structure being electrically connected with one gate layer, and different conductive structures being electrically connected with different gate layers, any two adjacent ones of the conductive structures having a spacing therebetween, each conductive structure comprising an upper end and a lower end opposite to the upper end, the lower end being disposed in the same layer as the gate layer, and orthographic projections of upper ends of at least two of the conductive structures on a reference plane at least partially overlapping, and the reference plane being perpendicular to the second direction, wherein the gate layer comprises a body portion in the memory region, and second conductive pathways on two sides of the first gate isolation structures, the second conductive pathways extending along the first direction, and being electrically connected with the body portion, and the stack structure further comprises dielectric patterns located in the connection region, each dielectric pattern and one of the gate layers being disposed in the same layer, and the dielectric pattern being located between the second conductive pathways.

2. The semiconductor structure of claim 1, wherein the conductive structures are arranged in multiple columns, each column including at least two conductive structures disposed along the second direction, and the orthographic projections of the upper ends of the at least two conductive structures of the same column on the reference plane overlapping.

3. The semiconductor structure of claim 2, wherein a spacing between the upper ends of two adjacent ones of the conductive structures of the same column is greater than or equal to 500 nm.

4. The semiconductor structure of claim 3, wherein the conductive structures are arranged in at least two rows, each row including at least two conductive structures disposed along the first direction; and the semiconductor structure further comprises a second gate isolation structure located between two adjacent rows of the conductive structures and extending along the first direction, a spacing being disposed between the second gate isolation structure and each of the two adjacent rows of the conductive structures.

5. The semiconductor structure of claim 4, wherein the gate layer comprises a body portion in the memory region, and two first conductive pathways on two sides of the second gate isolation structure, the first conductive pathways running through the connection region along the first direction, and being electrically connected with the body portion, and the conductive structure being electrically connected with the first conductive pathway.

6. The semiconductor structure of claim 4, wherein a spacing between the second gate isolation structure and the upper ends of the two adjacent rows of the conductive structures is greater than or equal to 600 nm; and a spacing between the upper ends of two adjacent ones of the conductive structures is greater than or equal to 500 nm along the first direction.

7. The semiconductor structure of claim 5, wherein the second gate isolation structure comprises second isolation substructures extending along the first direction, and two adjacent ones of the second isolation substructures have a spacing therebetween;

the gate layer further comprises a connection portion between two adjacent ones of the second isolation substructures; and the connection portion is electrically connected with the two first conductive pathways.

8. The semiconductor structure of claim 7, wherein along the first direction, a spacing between upper ends of two adjacent ones of the second isolation substructures is less than or equal to 600 nm.

9. The semiconductor structure of claim 7, wherein the second gate isolation structure runs through the connection region along the first direction.

10. The semiconductor structure of claim 4, further comprising first dummy channel structures between the second gate isolation structure and each of the two adjacent rows of the conductive structures.

11. The semiconductor structure of claim 4, further comprising at least one third gate isolation structure located in the memory region and extending along the first direction, the at least one third gate isolation structure dividing the memory region into at least two memory fingers, wherein the second gate isolation structure and the third gate isolation structure have a spacing therebetween.

12. The semiconductor structure of claim 11, further comprising:

memory channel structures in the memory fingers, the memory channel structures being arranged in multiple rows, each memory finger comprising 4N rows of channel structures, where N is an integer greater than or equal to 2;

a select gate stack structure disposed on the stack structure, and comprising a conductor layer and a second dielectric layer that are disposed in a stack-up manner; and semiconductor contact pillars running through the select gate stack structure, one semiconductor contact pillar being electrically connected with one of the memory channel structures.

13. The semiconductor structure of claim 12, wherein each block comprises three memory fingers, and each memory finger comprises twelve or sixteen rows of memory channel structures.

14. The semiconductor structure of claim 11, further comprising:

memory channel structures in the memory fingers, the memory channel structures being arranged in multiple rows, each memory finger comprising 4N rows of channel structures, where N is an integer greater than or equal to 2;

at least one row of second dummy channel structures located in the memory finger, and located between two adjacent rows of the memory channel structures; and at least one top select gate cut structure running through at least one gate layer at a top of the stack structure, an orthographic projection of one top select gate cut structure on a lower surface of the stack structure at least partially overlapping with an orthographic projection of one row of the second dummy channel structures on the lower surface of the stack structure.

15. The semiconductor structure of claim 14, wherein each block comprises four memory fingers, and each memory finger comprises eight rows of the memory channel structures and one row of the second dummy channel structures, and along the second direction, four rows of the memory channel structures are disposed on each of two sides of the one row of the second dummy channel structures.

16. The semiconductor structure of claim 1, wherein each of the conductive structures comprises:

a first portion disposed in the same layer as the gate layer and electrically connected with the gate layer, the first portion being the lower end of the conductive structure; and a second portion connected with the first portion and running through the stack structure upwards, an orthographic projection of the second portion on the first portion being located within extent of the first portion.

17. The semiconductor structure of claim 16, wherein the first portion is electrically connected with the second conductive pathway.

18. The semiconductor structure of claim 1, wherein in the stack structure, the gate layers and the first dielectric layers are disposed alternately along a third direction perpendicular to the first direction and the second direction, and the different conductive structures are different in size from the upper end to the lower end along the third direction.

19. A three-dimensional (3D) memory, comprising:

a semiconductor structure comprising:

a stack structure comprising gate layers and first dielectric layers disposed alternately;

first gate isolation structures extending along a first direction and arranged at intervals along a second direction, the first gate isolation structures dividing the stack structure into at least one block comprising a memory region and a connection region that are distributed along the first direction, the first direction being perpendicular to the second direction; and conductive structures in the connection region, each conductive structure being electrically connected with one gate layer, and different conductive structures being electrically connected with different gate layers, any two adjacent ones of the conductive structures having a spacing therebetween, each conductive structure comprising an upper end and a lower end opposite to the upper end, the lower end being aligned with the one gate layer, and orthographic projections of upper ends of at least two of the conductive structures on a reference plane at least partially overlapping, and the reference plane being perpendicular to the second direction, wherein the gate layer comprises a body portion in the memory region, and second conductive pathways on two sides of the first gate isolation structures, the second conductive pathways extending along the first direction, and being electrically connected with the body portion, and the stack structure further comprises dielectric patterns located in the connection region, each dielectric pattern and one of the gate layers being disposed in the same layer, and the dielectric pattern being located between the second conductive pathways; and a periphery device electrically connected with the semiconductor structure.

20. A memory system, comprising:

a three-dimensional (3D) memory comprising:

a semiconductor structure comprising:

a stack structure comprising gate layers and first dielectric layers disposed alternately;

first gate isolation structures extending along a first direction and arranged at intervals along a second direction, the first gate isolation structures dividing the stack structure into at least one block comprising a memory region and a connection region that are distributed along the first direction, the first direction being perpendicular to the second direction; and conductive structures in the connection region, each conductive structure being electrically connected with one gate layer, and different conductive structures being electrically connected with different gate layers, any two adjacent ones of the conductive structures having a spacing therebetween, each conductive structure comprising an upper end and a lower end opposite to the upper end, the lower end being aligned with the one gate layer, and orthographic projections of upper ends of at least two of the conductive structures on a reference plane at least partially overlapping, and the reference plane being perpendicular to the second direction, wherein the gate layer comprises a body portion in the memory region, and second conductive pathways on two sides of the first gate isolation structures, the second conductive pathways extending along the first direction, and being electrically connected with the body portion, and the stack structure further comprises dielectric patterns located in the connection region, each dielectric pattern and one of the gate layers being disposed in the same layer, and the dielectric pattern being located between the second conductive pathways; and a periphery device electrically connected with the semiconductor structure; and a controller electrically connected with the 3D memory to control the 3D memory to store data.

* * * * *